United States Patent
Kurosawa

(10) Patent No.: US 6,933,211 B2
(45) Date of Patent: Aug. 23, 2005

(54) SEMICONDUCTOR DEVICE WHOSE SEMICONDUCTOR CHIP HAS CHAMFERED BACKSIDE SURFACE EDGES AND METHOD OF MANUFACTURING THE SAME

(75) Inventor: Tetsuya Kurosawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/911,493

(22) Filed: Aug. 5, 2004

(65) Prior Publication Data

US 2005/0029628 A1 Feb. 10, 2005

Related U.S. Application Data

(62) Division of application No. 10/685,412, filed on Oct. 16, 2003.

(30) Foreign Application Priority Data

Oct. 17, 2002 (JP) .......................................... 2002-303377

(51) Int. Cl.[7] .............................................. H01L 21/78
(52) U.S. Cl. ........................ 438/460; 438/464; 438/113; 438/114; 438/115; 438/259; 438/270
(58) Field of Search ................................ 438/460, 464, 438/113, 114, 115, 259, 270

(56) References Cited

U.S. PATENT DOCUMENTS

| 4,583,283 A | | 4/1986 | Dubois et al. |
| 4,903,107 A | * | 2/1990 | Wei .............................. 257/647 |
| 5,153,700 A | | 10/1992 | Ohara |
| 5,376,179 A | | 12/1994 | Lee |
| 5,843,846 A | * | 12/1998 | Nguyen et al. ............. 438/713 |
| 5,851,928 A | * | 12/1998 | Cripe et al. ................. 438/748 |
| 6,583,512 B2 | | 6/2003 | Nakaoka et al. |
| 2002/0050637 A1 | | 5/2002 | Sekiya |

FOREIGN PATENT DOCUMENTS

| JP | 61-112345 | | 5/1986 | |
| JP | 64-59847 | * | 3/1989 | ................. 438/396 |
| JP | 2-240975 | | 9/1990 | |
| JP | 4-116849 | | 4/1992 | |
| JP | 5-206268 | | 8/1993 | |
| JP | 2000-340530 | | 12/2000 | |
| JP | 2002-16021 | | 1/2002 | |

* cited by examiner

*Primary Examiner*—Jasmine Clark
(74) *Attorney, Agent, or Firm*—Finnegan, Henderson, Farabow, Garrett & Dunner, L.L.P.

(57) ABSTRACT

A semiconductor element is formed in the major surface of a semiconductor chip. Curved surfaces having a radius of curvature of 0.5 to 50 µm are formed at at least some of edges where the side surfaces and backside surface of the semiconductor chip cross.

11 Claims, 7 Drawing Sheets

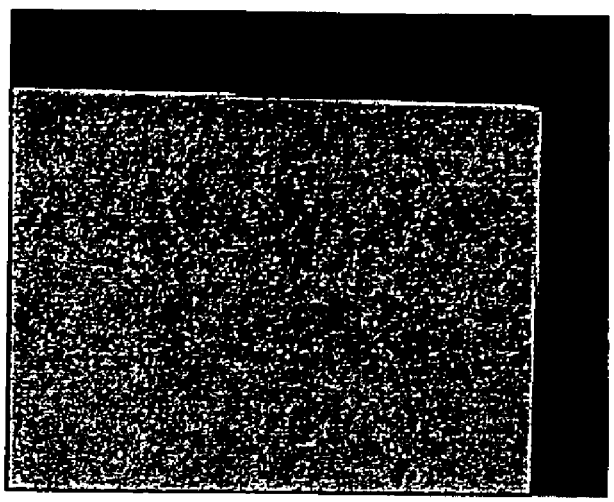
F I G. 7A
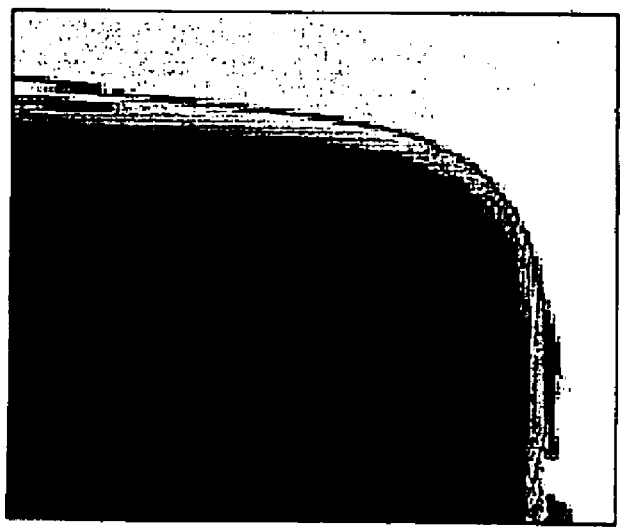
F I G. 7B

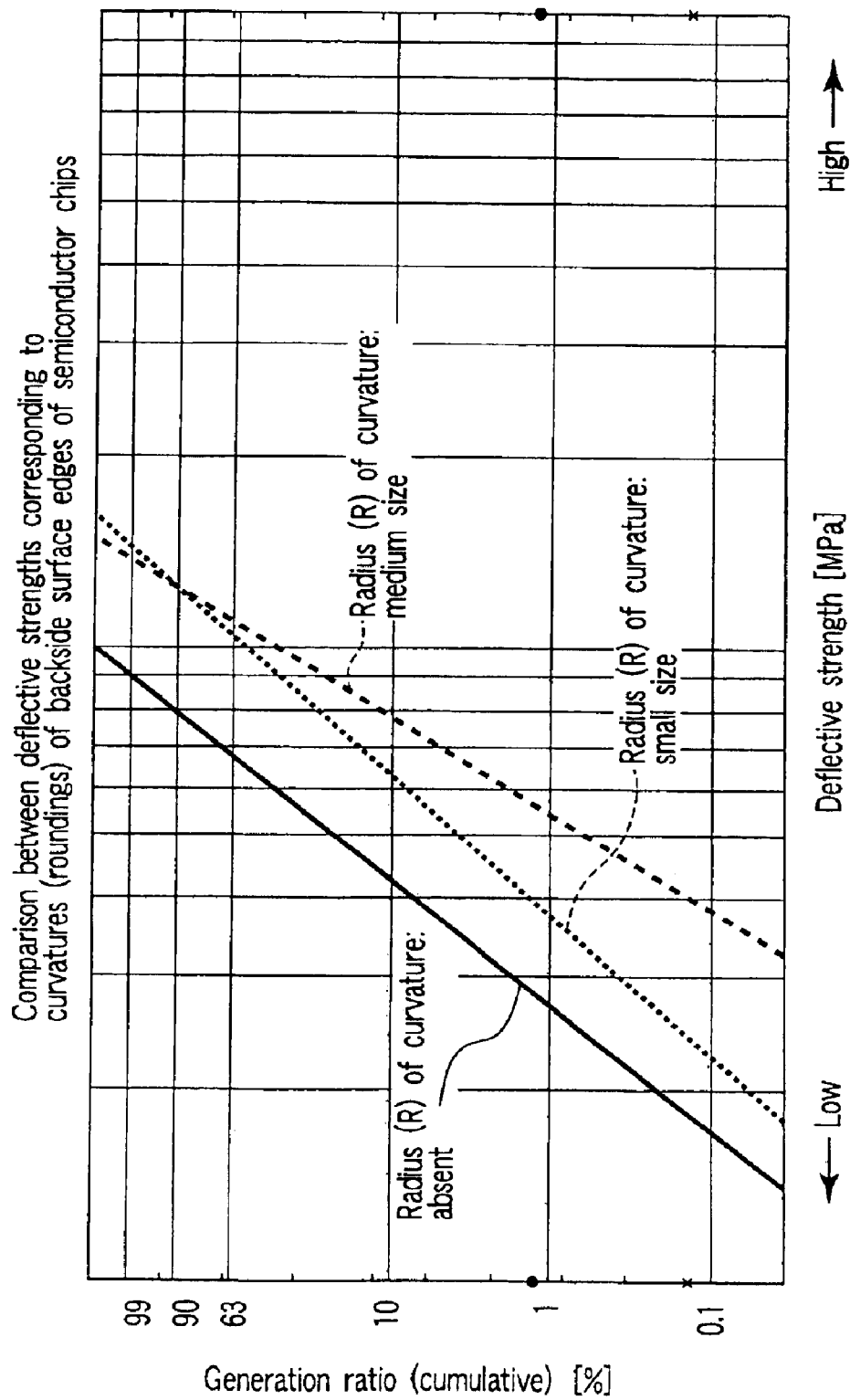
F I G. 10

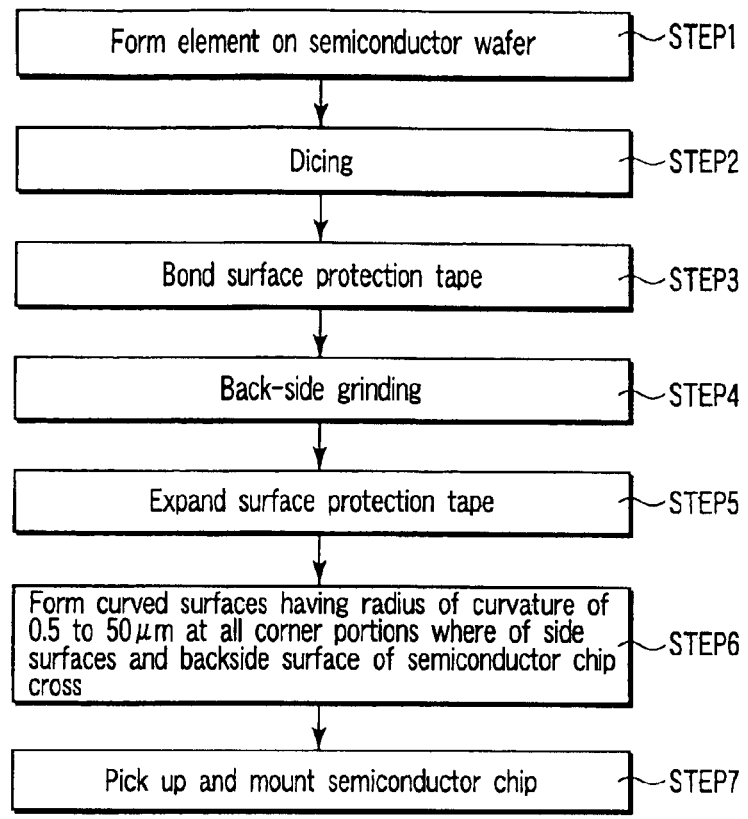
F I G. 11
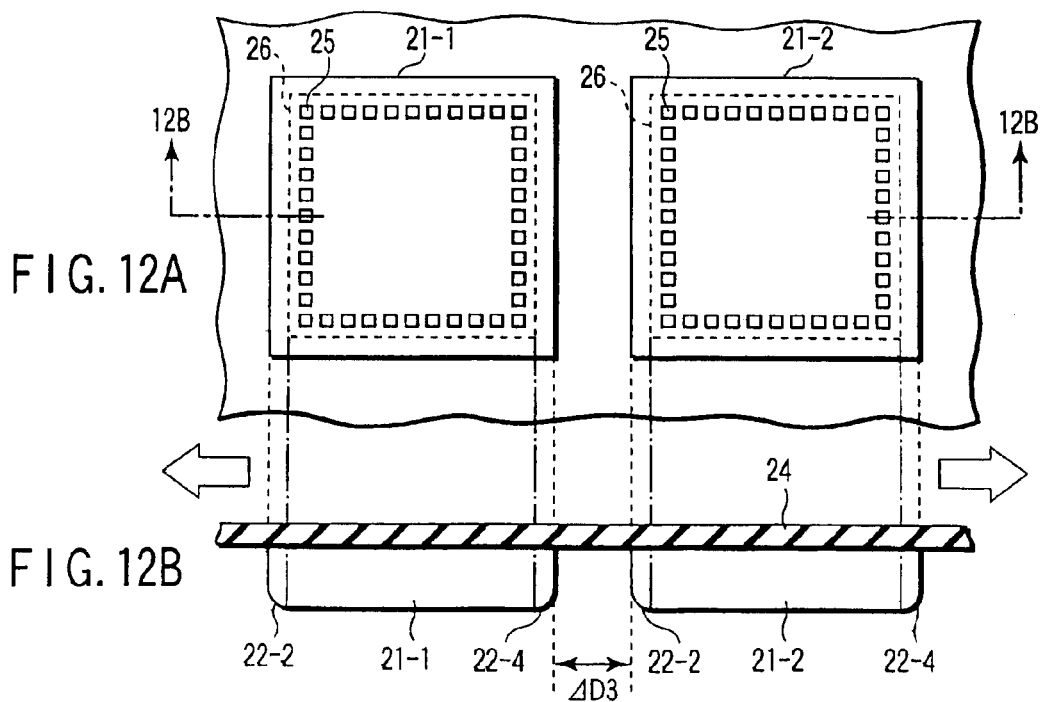
F I G. 12A
F I G. 12B

SEMICONDUCTOR DEVICE WHOSE SEMICONDUCTOR CHIP HAS CHAMFERED BACKSIDE SURFACE EDGES AND METHOD OF MANUFACTURING THE SAME

CROSS-REFERENCE TO RELATED APPLICATIONS

This is a division of application Ser. No. 10/685,412, filed Oct. 16, 2003, which is incorporated herein by reference.

This application is based upon and claims the benefit of priority from the prior Japanese Patent Application No. 2002-303377, filed Oct. 17, 2002, the entire contents of which are incorporated herein by reference.

BACKGROUND OF THE INVENTION

1. Field of the Invention

The present invention relates to a semiconductor device in which the backside surface (or lower surface) edges are chamfered to increase the deflective strength of a semiconductor chip and a method of manufacturing the same.

2. Description of the Related Art

As shown in FIG. 1, the edges between side surfaces 11-1 to 11-4 and a backside surface 11A of a semiconductor chip 11 generally have a number of three-dimensional patterns of chippings 12 formed at the time of dicing. FIGS. 2A, 2B, and 2C are SEM (Scanning Electron Microscope) photographs of the semiconductor chip 11. FIGS. 2A and 2B are SEM photographs of one corner portion of the semiconductor chip 11 viewed from the side of the backside surface 11A. FIG. 2C is an SEM photograph of the semiconductor chip 11 viewed from a side surface.

As described above, the edges of the conventional semiconductor chip 11 have a number of defects due to chippings in the dicing process or the like.

For this reason, when a pressure F is applied to the side of an element formation surface 11B, as shown in FIG. 3A, the semiconductor chip 11 readily breaks from the chipping 12, as shown in FIG. 3B. The pressure F is generated when the semiconductor chip is picked up and mounted on, e.g., a lead frame or TAB tape in a mount process, or due to the difference in thermal expansion properties between the package material and the semiconductor chip 11. When the pressure F is applied to the side of the element formation surface 11B, stress concentration on the chipping 12 occurs. Hence, the semiconductor chip 11 breaks from the chipping 12.

To decrease the number of chippings at the edges of the backside surface 11A of the semiconductor chip 11, a technique called a DBG (Dicing Before Grinding) method has been proposed (e.g., Jpn. Pat. Appln. KOKAI Publication No. 61-112345). When this technique is used, the chippings 12 generated at the edges between the backside surface 11A and the side surfaces 11-1 to 11-4 of the semiconductor chip 11 can greatly be suppressed, as shown in FIG. 4. FIGS. 5A, 5B, and 5C are SEM photographs of the semiconductor chip 11 formed using the DBG method. FIGS. 5A and 5B are SEM photographs of one corner portion of the semiconductor chip 11 viewed from the side of the backside surface 11A. FIG. 5C is an SEM photograph of the semiconductor chip 11 viewed from a side surface.

However, when the semiconductor chip 11 is thin (e.g., 100 μm or less) or long, stress concentrates at the edges of the backside surface 11A of the semiconductor chip 11 even when no chippings 12 are present. Hence, the strength of the semiconductor chip 11 considerably decreases.

Hence, the semiconductor chip 11 breaks during the assembly process up to when the semiconductor chip 11 is packaged or at the time of reliability test, resulting in a defective chip.

BRIEF SUMMARY OF THE INVENTION

According to an aspect of the present invention, there is provided a semiconductor device, wherein a semiconductor substrate has a semiconductor element which is formed in a major surface, and at least some of edges where side surfaces of the semiconductor substrate and a backside surface of the major surface cross comprise curved surfaces having a radius of curvature of 0.5 to 50 μm.

According to another aspect of the present invention, there is provided a method of manufacturing a semiconductor device, comprising forming trenches from a major surface side of a semiconductor wafer having an element formed thereon, along dicing lines or chip division lines of the semiconductor wafer, the trenches having a depth not to reach a backside surface of the semiconductor wafer, removably affixing a surface protection tape to an element formation surface of the semiconductor wafer, executing backside grinding of the semiconductor wafer to simultaneously thin the semiconductor wafer and separate the semiconductor wafer into individual semiconductor substrates, and forming curved surfaces having a radius of curvature of 0.5 to 50 μm at at least some of portions where side surfaces and a backside surface of the semiconductor substrate cross.

BRIEF DESCRIPTION OF THE SEVERAL VIEWS OF THE DRAWING

FIG. 7A is an SEM photograph showing one corner portion of the semiconductor chip viewed from the backside surface side so as to explain the semiconductor device according to the embodiment of the present invention;

FIG. 7B is an SEM photograph showing the semiconductor chip enlarged from a side surface so as to explain the semiconductor device according to the embodiment of the present invention;

FIG. 10 is a graph showing the relationship between the deflective strength and the defective generation ratio (cumulative) in a semiconductor chip depending on the difference in radius of curvature;

FIG. 11 is a flow chart for explaining a method of manufacturing a semiconductor device according to the embodiment of the present invention;

FIG. 12A is a perspective plan view showing a surface protection tape so as to explain details of some steps in the method of manufacturing the semiconductor device according to the embodiment of the present invention; and FIG. 12B is a sectional view taken along a line 12B—12B in FIG. 12A.

DETAILED DESCRIPTION OF THE INVENTION

Figure 1:
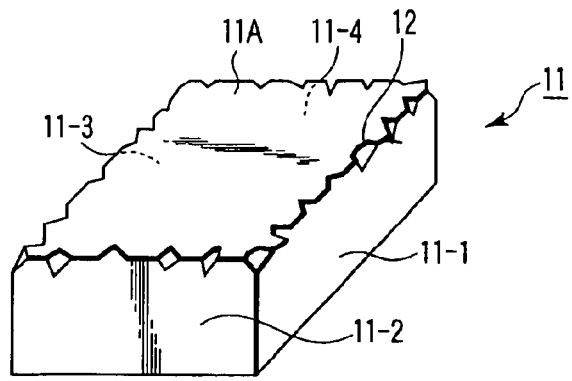
FIG. 1 is a perspective view showing a semiconductor chip viewed from the backside surface side so as to explain a conventional semiconductor device.
Figure 3A:
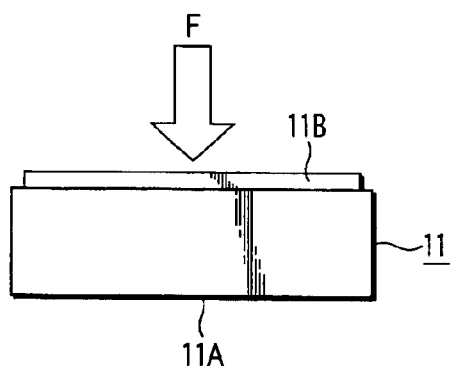
FIG. 3A is a side view for explaining stress applied to the semiconductor chip so as to explain the conventional semiconductor device.
Figure 3B:
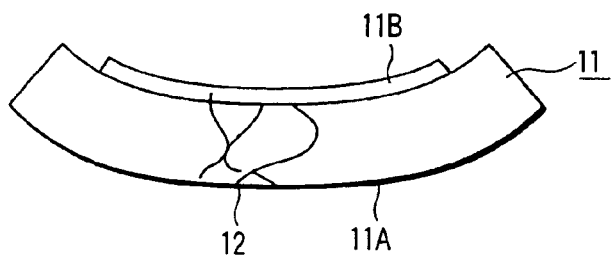
FIG. 3B is a side view for explaining crack formation so as to explain the conventional semiconductor device.
Figure 4:
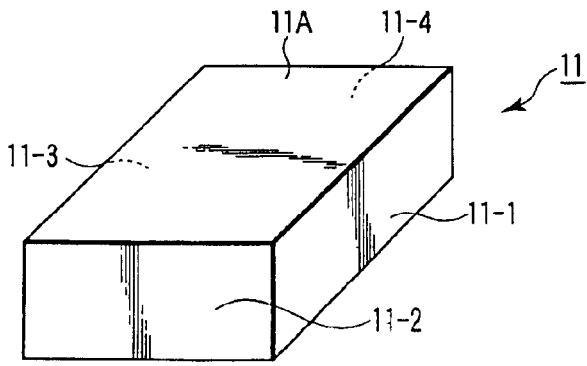
FIG. 4 is a perspective view showing a semiconductor chip viewed from the backside surface side so as to explain a conventional improved semiconductor device.
Figure 2A:
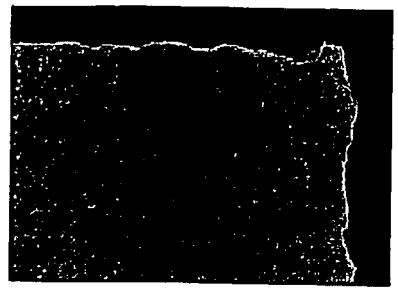
FIGS. 2A and 2B are SEM photographs showing one corner portion of the semiconductor chip viewed from the backside surface side so as to explain the conventional semiconductor device.
Figure 2B:
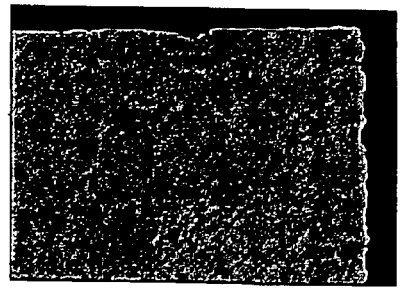
Figure 2C:
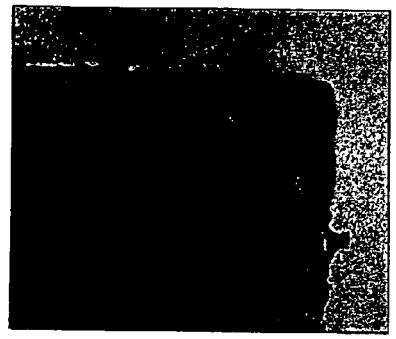
FIG. 2C is an SEM photograph showing a side surface of the semiconductor chip so as to explain the conventional semiconductor device.
Figure 5A:
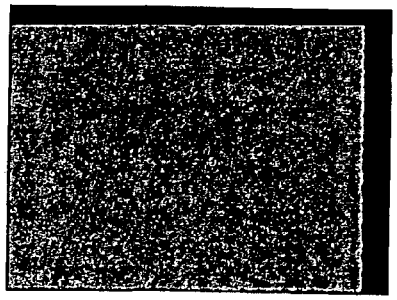
FIGS. 5A and 5B are SEM photographs showing one corner portion of the semiconductor chip viewed from the backside surface side so as to explain the conventional improved semiconductor device.
Figure 5B:
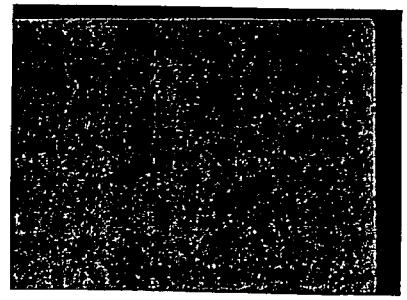
Figure 5C:
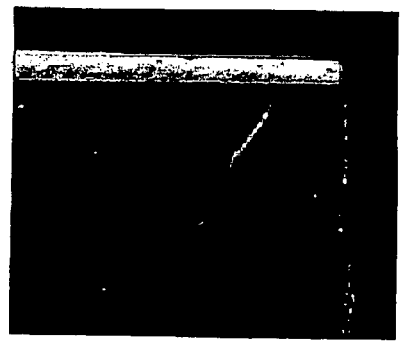
FIG. 5C is an SEM photograph showing a side surface of the semiconductor chip so as to explain the conventional improved semiconductor device.
Figure 6:
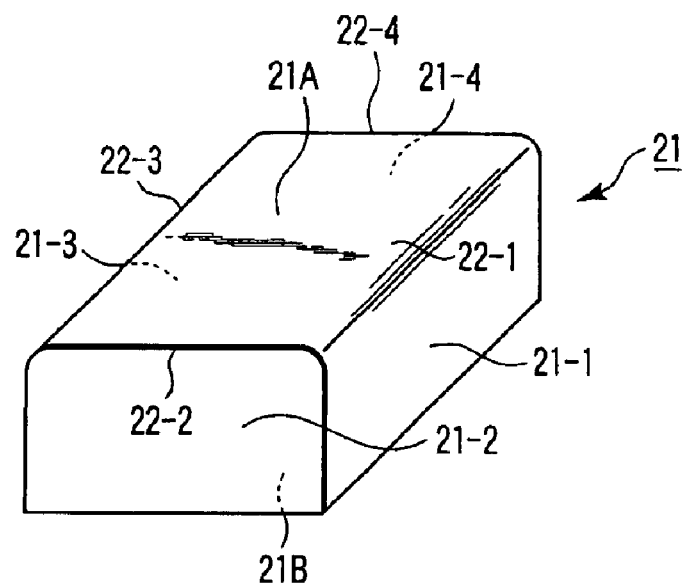
FIG. 6 is a perspective view showing a semiconductor chip viewed from the backside surface side of the element formation surface so as to explain a semiconductor device according to an embodiment of the present invention.

FIGS. 6, 7A, and 7B are views for explaining a semiconductor device according to an embodiment of the present invention. FIG. 6 is a perspective view showing a semiconductor chip (semiconductor substrate) 21 viewed from the side of a backside surface 21A of an element formation surface 21B. FIG. 7A is an SEM photograph showing one corner portion of the semiconductor chip 21 viewed from the side of the backside surface 21A. FIG. 7B is an SEM photograph showing the semiconductor chip 21 enlarged from a side surface.

Note that the semiconductor chip 21 has a structure in which a semiconductor element is formed on the major surface of a silicon wafer as a chip corresponding to a substrate.

In this embodiment, as shown in FIG. 6, curved surfaces 22-1 to 22-4 having radii (R) of curvature within the range of 0.5 to 50 $\mu$m are formed at all portions (edges) where side surfaces 21-1 to 21-4 and the backside surface 21A of the semiconductor chip 21 cross. The curved surfaces 22-1 to 22-4 are formed not to affect the element and interconnections, which are formed on the side of the major surface 21B of the semiconductor chip 21. For example, the curved surfaces are formed in regions outside the bonding pads formed on the major surface 21B of the semiconductor chip 21. Accordingly, any crack formation in the semiconductor chip 21 due to a pressure applied at the time of bonding can be suppressed. When the semiconductor chip 21 has a guard ring, the curved surfaces are formed in regions outside the guard ring, thereby preventing any influence on the electrical characteristics of the element.

Figure 8:
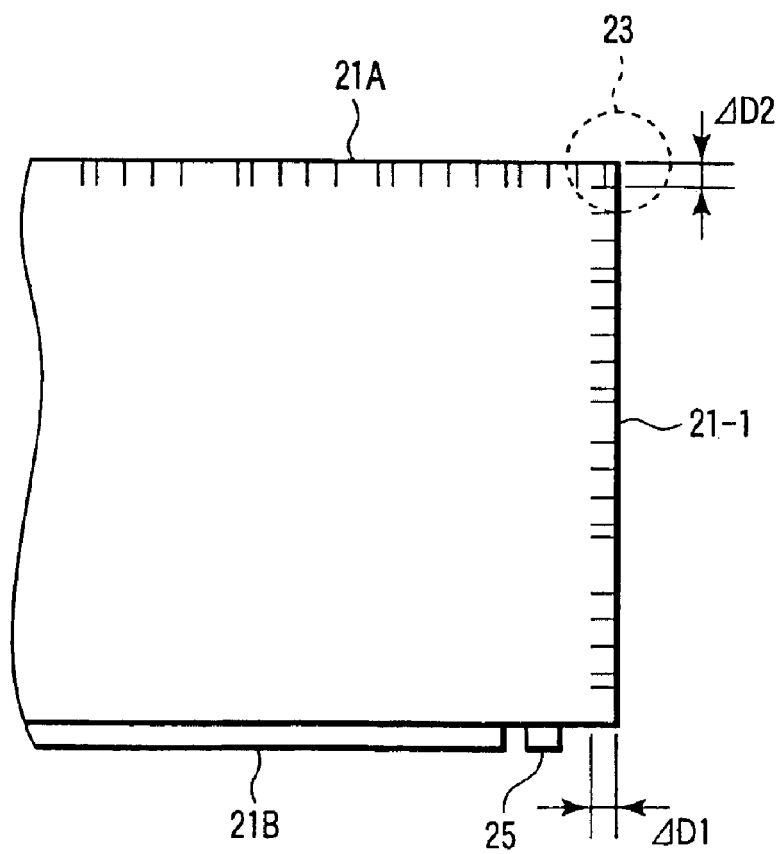
FIG. 8 is an enlarged side view showing the semiconductor chip at the time of cutting by dicing or grinding by BSG.

According to experiments conducted by the present inventor, the curved surfaces 22-1 to 22-4 exhibit a deflective strength increasing effect when the radius (R) of curvature is about 0.5 $\mu$m or more. It is supposed that depths $\Delta D1$ and $\Delta D2$ of flaws (crush layers) formed in the semiconductor chip 21 at the time of cutting by dicing or grinding by BSG are about 0.5 $\mu$m, as shown in FIG. 8, and the deflective strength can be increased by removing the crush layers at the edges. Especially, the crush layers (damages) formed at portions where the side surfaces 21-1 to 21-4 and backside surface 21A of the semiconductor chip 21 cross and at corner portions 23 have a large influence on the deflective strength. When the portions where the side surfaces 21-1 to 21-4 and backside surface 21A cross and their corner portions 23 are processed into shapes having a radius of curvature of at least 0.5 $\mu$m, the influence of damage can be suppressed.

Even when the semiconductor chip is picked up and mounted on, e.g., a lead frame or TAB tape in a mount process, or the package material and the semiconductor chip 21 have a difference in thermal expansion properties after encapsulation, the curved surfaces 22-1 to 22-4 suppress stress concentration at the edges of the semiconductor chip 21. From this viewpoint as well, the deflective strength (flexural strength) can be increased.

The present inventor confirmed that when the thickness of the semiconductor chip 21 is 20 to 40 $\mu$m, the radius of curvature of the curved surfaces 22-1 to 22-4 is preferably about 20 $\mu$m, and a deflective strength of 1 GPa close to the strength of the silicon itself can be obtained. The effect is obtained when the thickness of the semiconductor chip 21 is 20 to 60 $\mu$m. The effect is large when the thickness is 20 to 40 $\mu$m. If the semiconductor chip 21 is thin, it readily breaks. If the semiconductor chip 21 is sufficiently thick, it does not break, and the effect of curved surfaces becomes small. When the radius of curvature exceeds 50 $\mu$m, and a pressure is applied to bonding pads 25 formed on the side of the major surface 21B of the semiconductor chip 21 in the wire bonding process or the like, cracks may be formed. To suppress any decrease in strength of the semiconductor chip 21, the semiconductor chip 21 is preferably smaller than 50 $\mu$m.

The curved surfaces 22-1 to 22-4 preferably have no inflection points to more effectively suppress stress concentration.

Figure 9:
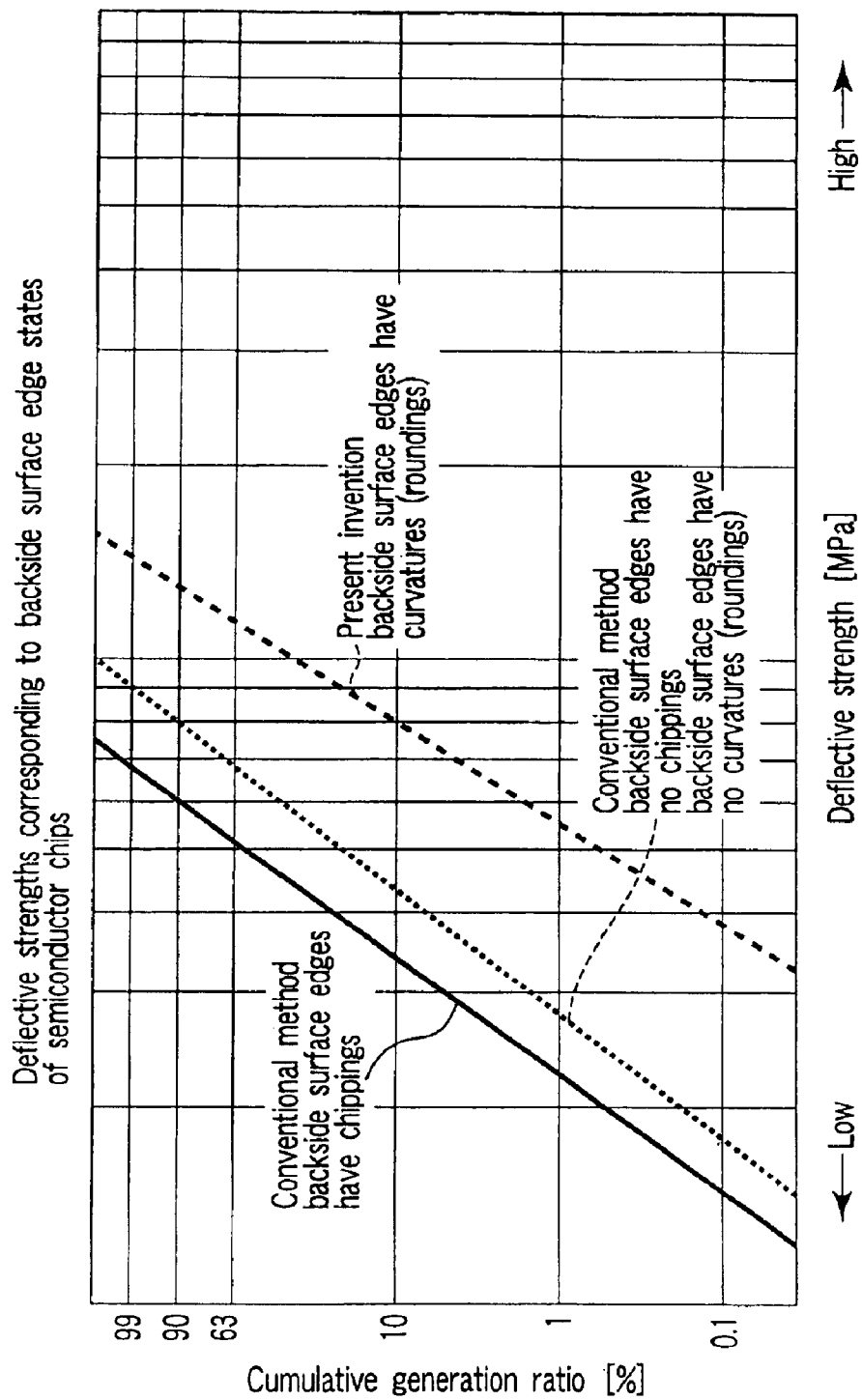
FIG. 9 is a graph showing the relationship between the deflective strength and the defective generation ratio (cumulative) in semiconductor chips according to the present invention and the prior arts (a case wherein chippings are present at the backside surface edges and a case wherein no chippings are present)

FIG. 9 is a graph showing the relationship between the deflective strength and the defective generation ratio (cumulative) in semiconductor chips according to the present invention and the prior arts (a case wherein chippings are present at the backside surface edges and a case wherein no chippings are present). As shown in FIG. 9, when no chippings are present at the backside surface edges, the deflective strength becomes higher than the case with chippings. In the present invention, the deflective strength can be further increased.

FIG. 10 is a graph showing the relationship between the deflective strength and the defect generation ratio (cumulative) in a semiconductor chip depending on the difference in radius of curvature. The deflective strength is higher for a medium radius of curvature than for a small radius of curvature.

In this embodiment, the curved surfaces 22-1 to 22-4 are formed at all portions where the side surfaces 21-1 to 21-4 and backside surface 21A of the semiconductor chip 21 cross. Curved surfaces may also be formed at portions where the side surfaces 21-1 and 21-2, 21-2 and 21-3, 21-3 and 21-4, and 21-4 and 21-1 cross.

A method of manufacturing the semiconductor chip 21 having the above structure will be described next with reference to the flow chart shown in FIG. 11.

First, by a known manufacturing process, various kinds of elements are formed on the major surface of a semiconductor wafer (STEP1).

The major surface of the semiconductor wafer with the elements formed thereon is diced, and trenches, i.e., so-called half cut trenches having a depth not to reach the backside surface are formed from the major surface side of the wafer along the dicing lines or chip division lines (STEP2). To form the half cut trenches, for example, a diamond scriber, a diamond blade, or a laser scriber is used. The depth of trenches is made larger than the final thickness of the chip by about 10 to 30 $\mu$m (at least 5 $\mu$m). The extra depth is determined by the accuracy of the dicer and grinder.

Then, a surface protection tape is removably affixed to the element formation surface of the semiconductor wafer that has undergone half cutting and dicing, and the semiconductor wafer is attached to a wafer ring (STEP3). The surface protection tape prevents any damage to the element during the process of grinding the backside surface and thinning the wafer.

The backside surface of the wafer is ground (STEP4). In the backside grinding process, the backside surface of the wafer is ground to a predetermined thickness by rotating a wheel with a grindstone at a high speed of 4,000 to 7,000 rpm. The grindstone is formed by hardening artificial diamond with phenol resin. This backside grinding process is often executed biaxially. Alternatively, after the backside surface is uniaxially coarsely ground using a grindstone of No. 320 to 600, finishing is executed biaxially using grindstone of No. 1,500 to 2,000. Triaxial grinding may also be used. When grinding reaches the trenches, the semiconductor wafer is separated into individual semiconductor chips. After the semiconductor wafer is separated into chips, backside grinding is continued until a predetermined thickness. With this process, chippings formed at positions where the side surfaces and backside surface of the semiconductor chip cross can be removed.

Subsequently, the backside surface of the semiconductor chip is mirror-finished by wet etching, plasma etching, polishing, buffing, or CMP (Chemical Mechanical Polishing). With this process, streaks of backside grinding can be removed. Hence, the deflective strength can be further increased.

After the semiconductor wafer is separated into chips by backside grinding, a surface protection tape 24 is expanded, as indicated by arrows in FIGS. 12A and 12B, to increase the distance between semiconductor chips 21-1 and 21-2 to obtain a kerf width $\Delta$D3 of about 30 $\mu$m. Instead of expanding the surface protection tape 24, the cut width (trench width) may be increased in forming the half cut trenches. In any case, the kerf width $\Delta$D3 is preferably 10 $\mu$m or more.

In this state, a mechanical process, chemical process, or a combination of mechanical and chemical processes, e.g., CMP, wet etching, or dry etching is performed to form the curved surfaces 22-1 to 22-4. When the kerf width $\Delta$D3 is increased, as described above, roundabout grinding can be executed by CMP. Hence, curved surfaces can be formed at all portions where the side surfaces and backside surface of the semiconductor chip cross. When the curved surfaces are to be formed by wet etching, the etchant can readily go round about. Accordingly, the curved surfaces 22-1 to 22-4 having a radius of curvature of 0.5 to 50 $\mu$m can be formed. The radius of curvature can be controlled by the kerf width $\Delta$D3. When the kerf width $\Delta$D3 is large, the radius of curvature is large.

The curved surfaces 22-1 to 22-4 are formed in, e.g., regions outside the bonding pads 25 formed on the major surfaces of the semiconductor chips 21-1 and 21-2. In this case, cracks can be prevented from being formed in the semiconductor chips 21-1 and 21-2 due to a pressure applied in the bonding process later. When the semiconductor chips 21-1 and 21-2 have guard rings 26, the curved surfaces are formed in regions outside the guard rings. With this structure, the curved surfaces 22-1 to 22-4 can be prevented from affecting the elements or interconnections formed on the major surface sides of the semiconductor chips 21-1 and 21-2.

Then, the same procedures as in the known semiconductor device manufacturing method are executed. Mounting processes such as a semiconductor chip pickup process, a mount process to a lead frame or TAB tape, and a package encapsulating process are executed, thereby completing a semiconductor device (STEP7).

According to the above manufacturing method, DBG is performed, and then, CMP is executed. Hence, with a simpler process (a small number of manufacturing processes), a semiconductor chip whose backside surface edges have curved surfaces with a predetermined radius of curvature can be formed.

The present invention is not limited to the above embodiment, and various changes and modifications can be made.

[Modification 1]

In the above embodiment, the semiconductor wafer is separated into individual semiconductor chips using DBG. The present invention can also be applied to separate the semiconductor wafer by full cut dicing.

[Modification 2]

After the surface protection tape is affixed, the semiconductor wafer may be separated by cleavage, and after that, backside grinding may be executed. For example, the wafer is cleaved along the crystal orientation from trenches formed around the wafer by pressing a jig against the backside surface side of the wafer. Alternatively, the wafer is cleaved along the crystal orientation from trenches formed around the wafer by applying a load from the backside surface side of the wafer along the chip separation lines. Then, the wafer is cleaved along the crystal orientation from the trenches while sequentially moving the jig or wafer.

[Modification 3]

In the above embodiment, after the semiconductor wafer is separated into individual semiconductor chips, curved surfaces are formed by etching. Instead, curved surfaces may be formed by increasing the opening portions of the trenches by etching before backside grinding. Then, backside grinding is performed to separate the semiconductor wafer into individual semiconductor chips. As in the above embodiment, curved surfaces can be formed at all portions where the side surfaces and backside surface of the semiconductor chip cross.

[Modification 4]

In the above embodiment, curved surfaces are formed by etching. Instead, a mechanical or chemical process (wet etching/dry etching (plasma/laser or the like)) or CMP having both the chemical and mechanical processing characteristics may be performed. In a chemical process, after a mask is formed at portions other than edges, chemical etching may be performed to round the edges of the backside surface.

[Modification 5]

In the above embodiment, the backside surface of the semiconductor chip is mirror-finished. However, this process is not always essential. The deflective strength increasing effect can be obtained even when small three-dimensional patterns (three-dimensional patterns formed by a mechanical process) such as streaks remain on the side and backside surfaces of the semiconductor chip.

[Modification 6]

In the above embodiment, the surface protection tape is attached to the wafer ring. However, the wafer ring need not always be used.

In the above embodiment, curved surfaces having the above-described radius of curvature are formed at all portions where the side surfaces and backside surface of the semiconductor chip cross, as described above. However, depending on the shape of the semiconductor chip, such curved surfaces need not always be formed at all portions. For example, when the semiconductor chip has a rectangular shape, curved surfaces may be formed only at two long sides. The same effect as described above can be obtained by forming curved surfaces having the above-described radius of curvature at only necessary portions.

As described above, according to one aspect of this invention, a semiconductor device capable of increasing the deflective strength and a method of manufacturing the same can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

forming trenches from a major surface side of a semiconductor wafer having an element formed thereon, along dicing lines or chip division lines of the semiconductor wafer, the trenches having a depth not to reach a backside surface of the semiconductor wafer;

removably affixing a surface protection tape to an element formation surface of the semiconductor wafer;

executing backside grinding of the semiconductor wafer to simultaneously thin the semiconductor wafer and separate the semiconductor wafer into individual semiconductor substrates; and forming curved surfaces having a radius of curvature of 0.5 to 50 $\mu$m at least some of portions where side surfaces and a backside surface of the semiconductor substrate cross.

2. The method according to claim 1, wherein the curved surfaces are formed at all portions where the side surfaces and the backside surface of the semiconductor substrate cross.

3. The method according to claim 1, wherein the semiconductor substrate has a rectangular shape, and the curved surfaces are formed at edges corresponding to long sides of the semiconductor substrates.

4. The method according to claim 1, further comprising after executing backside grinding of the semiconductor wafer to simultaneously thin the semiconductor wafer and separate the semiconductor wafer into individual semiconductor substrates, mirror-finishing the backside surface of the semiconductor wafer.

5. The method according to claim 1, wherein the trench formation is executed using one of a diamond scriber, a diamond blade, and a laser scriber.

6. The method according to claim 1, further comprising after the trench formation, cleaving the semiconductor wafer from the trenches.

7. The method according to claim 1, further comprising before or after the surface protection tape removably affixing, attaching the surface protection tape to a wafer ring.

8. The method according to claim 1, wherein an interval between the semiconductor substrates is not less than 10 $\mu$m.

9. The method according to claim 1, wherein the curved surface formation includes one of a mechanical process, a chemical process, and a combination of mechanical and chemical processes.

10. The method according to claim 1, wherein the curved surface formation includes at least one of CMP, wet etching, and dry etching.

11. The method according to claim 1, wherein an interval between the semiconductor substrates corresponds to a kerf width.

* * * * *

UNITED STATES PATENT AND TRADEMARK OFFICE
CERTIFICATE OF CORRECTION

PATENT NO. : 6,933,211 B2
DATED : August 23, 2005
INVENTOR(S) : Kurosawa

It is certified that error appears in the above-identified patent and that said Letters Patent is hereby corrected as shown below:

Column 8,
Line 2, change "50 $\mu$m at least" to -- 50 $\mu$m at at least --.

Signed and Sealed this

First Day of November, 2005

JON W. DUDAS
*Director of the United States Patent and Trademark Office*